United States Patent
Kang et al.

(10) Patent No.: US 7,679,966 B2
(45) Date of Patent: Mar. 16, 2010

(54) FLASH MEMORY DEVICE AND READ METHOD THEREOF

(75) Inventors: Joo-Ah Kang, Seoul (KR); Jong Hwa Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 96 days.

(21) Appl. No.: 11/320,413

(22) Filed: Dec. 28, 2005

(65) Prior Publication Data

US 2006/0274588 A1 Dec. 7, 2006

(30) Foreign Application Priority Data

Jun. 3, 2005 (KR) .................. 10-2005-0047863

(51) Int. Cl.
*G11C 16/06* (2006.01)
(52) U.S. Cl. .................. 365/185.25; 365/185.21; 365/203
(58) Field of Classification Search .............. 365/203, 365/185.25, 149, 185.33
See application file for complete search history.

(56) References Cited

U.S. PATENT DOCUMENTS

| | | | |
|---|---|---|---|
| 5,761,132 A | 6/1998 | Kim | |
| 5,781,478 A * | 7/1998 | Takeuchi et al. | 365/185.11 |
| 5,841,721 A | 11/1998 | Kwon et al. | |
| 6,028,792 A * | 2/2000 | Tanaka et al. | 365/185.22 |
| 6,147,911 A * | 11/2000 | Takeuchi et al. | 365/185.28 |
| 6,208,573 B1 * | 3/2001 | Tanaka et al. | 365/203 |
| 6,480,419 B2 | 11/2002 | Lee | |
| 6,704,239 B2 | 3/2004 | Cho et al. | 365/230.04 |
| 6,717,857 B2 * | 4/2004 | Byeon et al. | 365/185.21 |
| 6,751,124 B2 | 6/2004 | Lee | |
| 6,813,187 B2 | 11/2004 | Lee | |
| 7,099,200 B2 * | 8/2006 | Sakui | 365/185.33 |
| 2003/0026145 A1 | 2/2003 | Lee | |
| 2003/0051093 A1 * | 3/2003 | Takeuchi | 711/103 |
| 2004/0264247 A1 | 12/2004 | Kim | 365/185.17 |
| 2005/0185468 A1 * | 8/2005 | Hosono et al. | 365/185.22 |

FOREIGN PATENT DOCUMENTS

KR 10-20020069092 A 8/2002

OTHER PUBLICATIONS

Sung-Mo Kang, CMOS Digital Integrated Circuits Analysis and Design, 3rd edition, 2003, Elizabeth A. Jones, McGraw-Hill.*

* cited by examiner

*Primary Examiner*—Vu A Le
*Assistant Examiner*—Han Yang
(74) *Attorney, Agent, or Firm*—Mills & Onello, LLP

(57) ABSTRACT

A flash memory device and a read method thereof are provided. At a read operation, a sense node of a page buffer is developed while a bitline is developed and data of a selected memory cell is sensed based on the develop result of the sense node. For a develop period, voltage loss arising from the sense node is compensated fast and the compensated result is latched, which makes it possible to simplify the design and reduce a chip size.

12 Claims, 4 Drawing Sheets

FLASH MEMORY DEVICE AND READ METHOD THEREOF

RELATED APPLICATION

This application relies for priority on Korean patent application number 05-47863, filed in the Korean Intellectual Property Office on Jun. 3, 2005, the contents of which are incorporated herein in their entirety by reference.

BACKGROUND

Field of the Invention

The present invention relates to non-volatile memory devices and, more particularly, to a flash memory device and a read method thereof.

Generally, semiconductor memory devices are categorized as volatile memory devices or non-volatile memory devices. Volatile memory devices are classified into dynamic random access memories (DRAMs) and static random access memories (SRAMs). Volatile semiconductor devices lose their data when their power supplies are interrupted, while non-volatile memory devices retain their stored data even when their power supplies are interrupted. Thus, non-volatile memories are widely used to store retention-required data irrespective of power supply interruption. Non-volatile memory includes mask read-only memories (MROMs), programmable read-only memories (PROMs), erasable programmable read-only memories (EPROMs), and electrically erasable programmable read-only memories (EEPROMs).

MROMs, PROMs, and EPROMs have difficulty in rewriting stored data because read and write operations cannot be freely conducted by normal users. On the other hand, EEPROMs are increasingly used in system programming that requires the continuous update or auxiliary memory devices. Particularly, flash EEPROMs are very advantageous to be used as mass storage devices because their integration density is higher than conventional EEPROMs. Among the flash EEPROMs, a NAND-type flash EEPROM has a much higher integration density than a NOR-type or AND-type flash EEPROM.

A flash memory includes flash EEPROM cells each having a P-type semiconductor substrate, N-type source and drain regions, a channel region between the source and drain regions, a floating gate for storing charges, and a control gate disposed over the floating gate. The operation of a flash memory device is divided into three modes such as program, erase, and read.

In order to store data in a flash EEPROM cell, a cell program operation is conducted after erasing the flash EEPROM cell. The erase operation is conducted by applying a voltage of 0 volt to a control gate and applying a high voltage, e.g., 20 volts, to a semiconductor substrate. Under such a voltage condition, negative charges accumulated into a floating gate are discharged to the substrate through a tunneling oxide by a FN tunneling mechanism. Thus, an effective threshold voltage Vth of the flash EEPROM cell transistor becomes negative, and the cell transistor is at a conductive state, i.e., "ON" state, when a predetermined voltage Vread is applied to the control gate during a read operation, i.e., Vth<Vread. At a state referred to as an erase state, the EEPROM cell stores logic "1" (or logic "0").

A program operation for a flash EEPROM cell is conducted by applying a high voltage, e.g., 18 volts, to a control gate and applying a voltage of 0 volt to a source, a drain, and a semiconductor substrate. Under such a voltage condition, negative charges are accumulated into the floating gate by F-N tunneling. Thus an effective threshold voltage Vth of the flash EEPROM cell becomes positive, and the cell transistor is in a nonconductive state, i.e., "OFF" state, when a predetermined read voltage is applied to the control gate, i.e., Vth>Vread. At a state referred to as a program state, the EEPROM cell stores logic "0" (or logic "1"). Such program and erase operations of a flash memory device are disclosed in U.S. Pat. No. 5,841,721 entitled "MULTI-BLOCK ERASE AND VERIFICATION IN A NONVOLATILE SEMICONDUCTOR MEMORY DEVICE AND A METHOD THEREOF".

To verify whether a memory cell is a programmed cell or an erased cell, a read voltage Vread, e.g., +4.5 volts, is applied to unselected wordlines and a voltage of 0 volt is applied to selected wordlines, which is called a read operation. As well known to those skilled in the art, a read operation is conducted using page buffers constructed in a flash memory device. An example of the gate buffer is disclosed in U.S. Pat. No. 5,761,132 entitled "INTEGRATED CIRCUIT MEMORY DEVICES WITH LATCH-FREE BUFFERS THEREIN FOR PREVENTING READ FAILURES".

Before a read operation is conducted, a bitline is precharged. When the bitline is precharged, it is charged to a specific precharge level. After the bitline is precharged, a read voltage Vread, e.g., +4.5 volts, is applied to unselected wordlines and a voltage of 0 volt is applied to a selected wordline. If a memory cell connected with the selected wordline is an erased cell, i.e., ON cell, the precharge level of the bitline goes to a low level, e.g., ground level). On the other hand, if the memory cell is a programmed cell, i.e., OFF cell, the precharge level of the bitline is maintained. That is, a precharge level of a bitline is variable with the program state of a memory cell, which is called "bitline develop". Further, time taken for the precharge level transition of a bitline is called "develop time".

After bitline develop is completed, a voltage of a sense node is maintained at a precharge level or goes to a low level according to the precharge level of a bitline. For example, if a bitline is maintained at a precharge level, a corresponding memory cell is detected as an OFF cell and a sense node is maintained at a precharged level. On the other hand, if a bitline goes to a low level, a corresponding memory cell is detected as an ON cell and a sense node is discharged to a low level. Afterwards, a voltage level of the sense node is latched as a read result. However, several problems arise at a read operation because there are parasitic capacitances CC0-CC2 between page buffers and sense nodes. The problems will now be described below in detail.

Generally, a sense node, e.g., SO0, corresponding to an OFF cell, is maintained at a floating state for a sensing period. When a voltage of an adjacent sense node, e.g., SO1, corresponding to an ON cell, drops along a bitline level, a voltage of the sense node maintained at the floating state is affected by a parasitic capacitance CC0 between the sense nodes SO0 and SO1. If the magnitude of, for example, the parasitic capacitance CC0 is small, a voltage of the sense node SO0 is barely affected by the parasitic capacitance CC0 and is maintained at the precharge level of a bitline. On the other hand, if the magnitude of, for example, the parasitic capacitance CC0 is large, the voltage of the sense node SO0 is affected by the parasitic capacitance CC0 and drops to the precharge level of the bitline. As described above, a voltage of a sense node SO0 corresponding to an OFF cell drops with the voltage fluctuation of an adjacent sense node SO1, which is called "coupled down" phenomenon. Since the coupled down phenomenon arising from adjacent sense nodes is affected by adjacent sense nodes disposed at both sides, a coupled-down voltage of the sense node SO0 drops more. If the voltage of the sense node SO0 drops below a trap voltage to change a latch value, a read error arises to detect an OFF cell as an ON cell.

As integration density of semiconductor memory devices increases and a design rule thereof decreases, the magnitude of parasitic capacitance CC0 between sense nodes SO0 and SO1 increases more. Therefore, with increase in integration density of semiconductor devices, sense nodes between pages buffers are capacitively coupled to increase the probability of the read error.

In this case, discharge and sense operations for sense nodes are not conducted until bitline develop is all completed. Voltages of the sense nodes are maintained at a precharge level or discharged to a low level according to the result of the bitline develop, which is done at one time. Therefore, it is probable that the voltages of the sense nodes are affected by voltage fluctuation of adjacent sense nodes. Since the sensing period has a very short duration just before latch is conducted after the bitline develop is all conducted, a read error arising from any sense node is not compensated.

SUMMARY OF THE INVENTION

Exemplary embodiments of the present invention are directed to a flash memory device and a read method thereof. In an exemplary embodiment, the read method includes precharging a bitline and a sense node; developing the bitline and the sense node; and sensing a data value of a selected memory cell in response to the develop result of the sense node.

According to another aspect, the invention is directed to a flash memory device including a memory cell array including a plurality of memory cells disposed at intersections of bitlines and wordlines; and a page buffer circuit including a plurality of page buffers for sensing data stored in the memory cells. Each of the page buffers precharges a corresponding bitline and a corresponding sense node and develops the sense node while the bitline is developed and senses a data value of a memory cell connected to a selected bitline in response to the develop result of the sense node.

According to another aspect, the invention is directed to a flash memory device including a memory cell array including a plurality of memory cells disposed at intersections of bitlines and wordlines; and a page buffer circuit including a plurality of page buffers for sensing data stored in the memory cells. Each of the page buffers includes a precharge circuit for precharging a corresponding bitline and a corresponding a sense node and developing the sense node while the bitline is developed; and a sense and latch circuit for sensing and storing a data value of a memory cell connected to a selected bitline in response to the develop result of the sense node.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Figure 1:
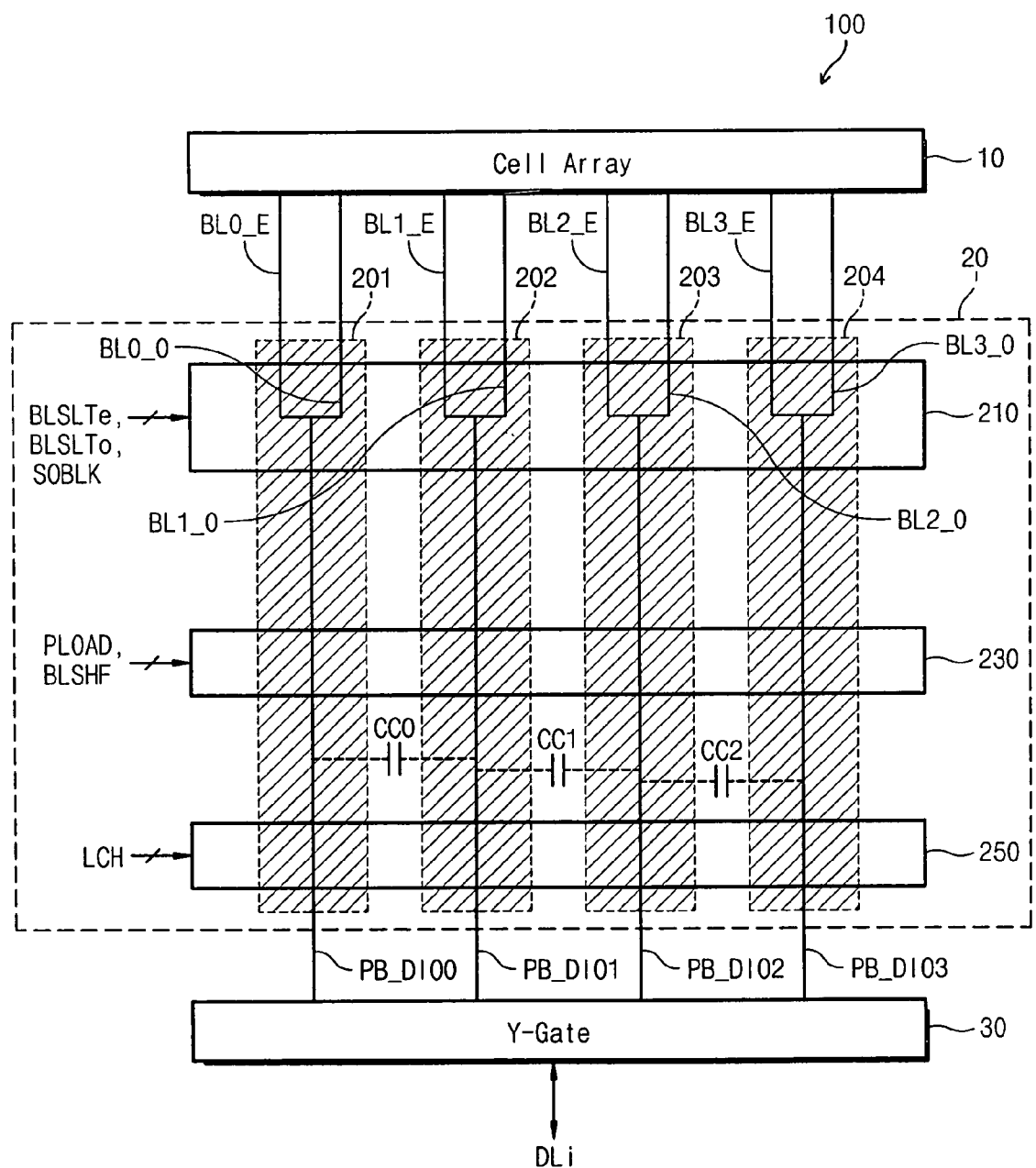
FIG. 1 is a block diagram of a flash memory device according to an embodiment of the present invention.

As illustrated in FIG. 1, a flash memory device according to the invention includes a memory cell array 10 serving as data storage. Although not shown in this figure, the memory cell array includes a plurality of cell strings (or NAND strings) each being connected to corresponding bitlines. As well known, each of the cell strings includes a string select transistor connected to a corresponding bitline, a ground select transistor connected to a common source line, and memory cells coupled serially between the string select transistor and the ground select transistor. A plurality of bitlines are connected with the memory cell array 10. In FIG. 1, only four bitline pairs (BL0_E, BL0_O), (BL1_E, BL1_O), (BL2_E, BL2_O), and (BL3_E, BL3_O) are shown among a plurality of bitline pairs.

Corresponding page buffers 201, 202, 203, and 204 are electrically connected with the respective bitline pairs. Each of the page buffers 201, 202, 203, and 204 acts as a sense amplifier at read/verify operations and acts as a driver for driving a bitline, according to the data to be programmed, at a program operation. In that the buffer pages 201, 202, 203, and 204 have the same configuration, the configuration of only one page buffer, e.g., page buffer 201, will be described, noting that the description is applicable to all of the page buffers. Accordingly, the same elements of the page buffers 201-204 are designated by the same numerals. Data are input/output to/from the page buffers 201, 202, 203, and 204 through a Y-Gate circuit 30.

Figure 2:
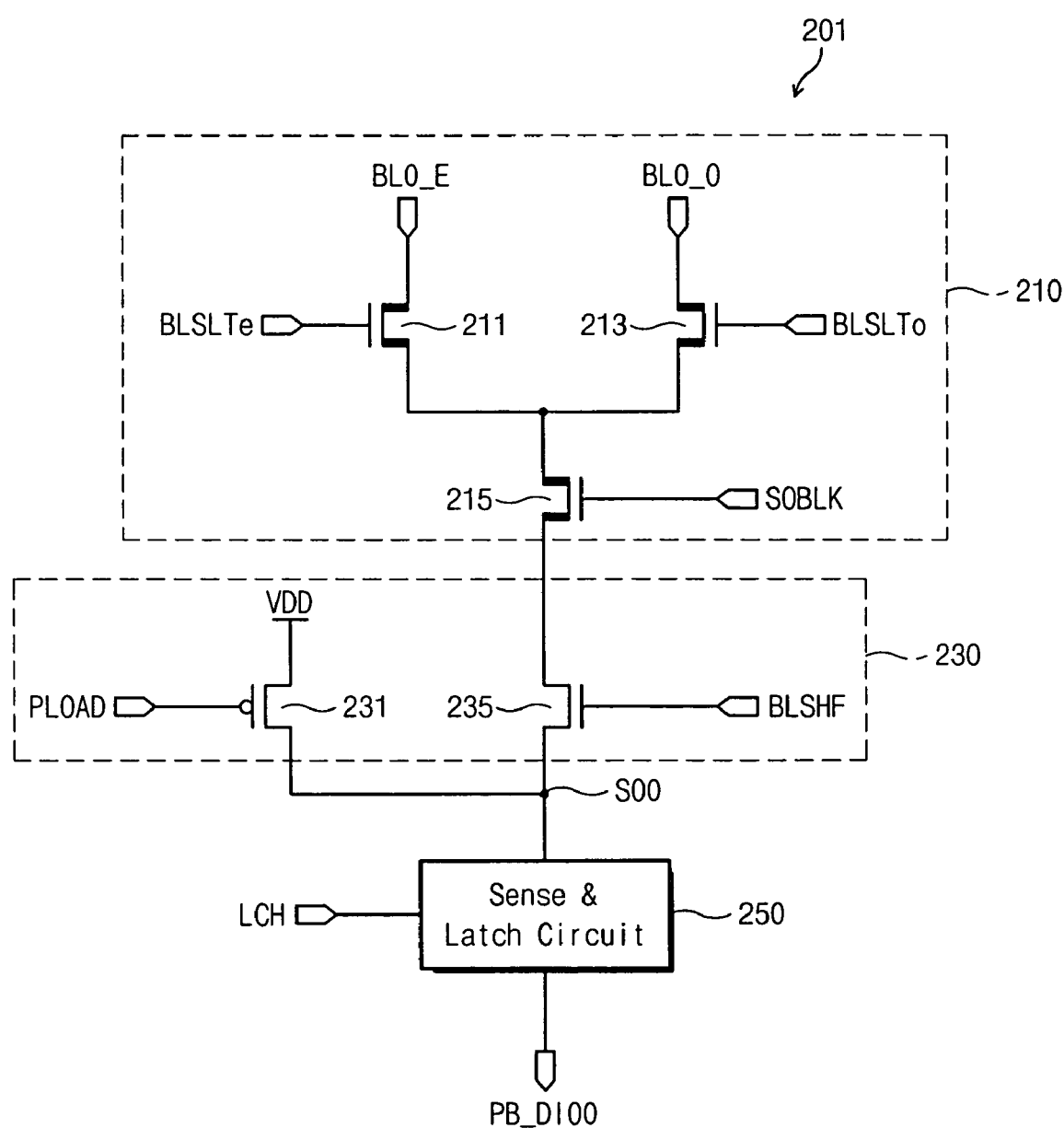
FIG. 2 is a circuit diagram of a page buffer shown in FIG. 1.

As illustrated in FIG. 2, the page buffer 201 includes a bitline select and bias circuit 210, a precharge circuit 230, and a sense and latch circuit 250. A sense node SO0 is constructed between the precharge circuit 230 and the latch circuit 250.

The bitline select and bias circuit 210 selects a bitline to be sensed, and the precharge circuit 230 precharges a bitline BL0_E and a sense node SO0 before reading memory cells connected with a selected bitline. At a read operation, the precharge circuit 230 develops the bitline BL0_E as well as the sense node SO0. Since a voltage of the sense node SO0 is fluctuated with the develop state of the bitline BL0_E while leaving a sufficient gap, the magnitude of a voltage fluctuation is small. Therefore, it is possible to prevent a read error resulting from the capacitive coupling between adjacent sense nodes. Further, the precharge circuit 230 recharges the sense node SO0 just before the voltage of the developed sense node SO0 is latched. As a result, voltage loss of the sense node SO0, which may arise for a develop period, is compensated to conduct an accurate read operation. The sense and latch circuit 250 senses the voltage of the sense node SO0 as a read result and latches the sensed voltage. According to the invention, the configurations of the bitline select circuit 210, the precharge circuit 230, and the sense and latch circuit 250 may be modified and altered without departing from the scope of the present invention. Particularly, the configuration of the sense and latch circuit 250 for sensing and latching the voltage of the sense node SO0 may have a variety of modified versions in data latch structure and data input/output path. Since a read method of the flash memory device according to the invention may be applied to any latch and sense circuit, the configuration of the sense and latch circuit 250 is not limited to a specific configuration.

An exemplary configuration of the bitline select and bias circuit 210 and the precharge circuit 230 will be described below in detail.

The bitline select and bias circuit 210 includes first, second, and third NMOS transistors 211, 213, and 215. The first and second NMOS transistors 211 and 213 are connected with corresponding bitlines BL0_E and BL0_O, respectively. The first and second NMOS transistors 211 and 213 select corresponding bitlines in response to bitline select signals BLSLTe and BLSLTo applied to gates, respectively. A pair of bitlines BL0_E and BL0_O are configured to share a page buffer 201. A selected one of the bitlines BL0_E and BL0_O is electrically connected to the precharge circuit 230 and the sense and latch circuit 250. For the convenience of description, it is assumed that among the bitline pair BL0_E and BL0_O connected to a page buffer 201, an even-number bitline BL0_E is selected while an odd-number bitline BL0_O is unselected.

The third NMOS transistor 215 is coupled between the first NMOS transistor 211 and the precharge circuit 230 and between the second NMOS transistor 213 and the precharge circuit 230, preventing a higher voltage than a power supply voltage Vdd from being applied directly to the page buffer 201, under control of a control signal SOBLK. As well known, the page buffer 201 is a low voltage circuit operating at a power supply voltage Vdd. Hence, when a higher voltage than the power supply voltage Vdd is directly applied to a low voltage circuit such as a page buffer, low voltage transistors constituting the page buffer 201 may be broken down or destroyed. For this reason, the first, second, and third transistors 211, 213, and 215 included in the bitline select and bias circuit 210 are high voltage transistors durable against high voltages. Each of the first, second, and third transistors 211, 213, and 215 is a high voltage transistor having a break down voltage of, for example, about 28 volts.

The precharge circuit 230 includes a PMOS transistor 231 and an NMOS transistor 235, which are low voltage transistors each having a breakdown voltage of, for example, about 7 volts. The PMOS transistor 231 is coupled between a power supply voltage Vdd and sense node SO0 and controlled by a precharge control signal PLOAD. The bitline BL0_E and the sense node SO0 are precharged to a precharge level depending upon whether the PMOS transistor 231 is turned on or off. Also, an operation of developing the sense node SO0 with a bitline and an operation of recharging the sense node SO0 just before latching an output of the sense node SO0 are controlled depending upon whether the PMOS transistors 231 is turned on or off, respectively. A voltage of the recharged sense node SO0 is sensed as a read voltage PBDIO_0 to be latched by the sense and latch circuit 250.

The NMOS transistor 235 is coupled between the third NMOS transistors 215 constructed in the bitline select and bias circuit 210 and the sense node SO0 and controlled by a shutoff control signal BLSHF. The NMOS transistor 235 electrically connects or insulates the bitline BL0_E to/from the sense node SO0. In view of the foregoing, the NMOS transistor 235 may be referred to as a shutoff transistor. In the NMOS transistor 235, the voltage of the sense node SO0 is controlled to be developed along the precharge level of the bitline BL0_E while developing the bitline BL0_E. For this, a drain terminal of the NMOS transistor 235 is coupled with the sense node SO0 and a source terminal thereof is connected with the bitline BL0_E through the bitline select and bias circuit 210. Further, a gate terminal of the NMOS transistor 235 is coupled with a control circuit (not shown) to receive the shutoff control signal BLSHF.

The precharge level of the bitline BL0_E is determined by a voltage level of the shutoff control signal BLSHF applied to the gate of the NMOS transistor 235 and a threshold voltage Vth of the NMOS transistor 235. If the shutoff control signal BLSHF is applied to a gate terminal of the NMOS transistor 235 and a power supply voltage Vdd is applied to a drain terminal, i.e., sense node SO0, of the NMOS transistor 235, the bitline BL0_E is precharged to a level of BLSHF-Vth (BLSHF being a voltage level of the shutoff control signal BLSHF, and Vth being a threshold voltage of the NMOS transistor 235).

After the bitline BL0_E is precharged to a predetermined precharge level, a read voltage Vread, e.g., +4.5 volts, is applied to unselected wordlines and a voltage of 0 volt is applied to a selected wordline to conduct a read operation. Consequently, a bitline develop is started. At this time, the PMOS transistor 231 of the precharge circuit 230 is turned off to cut off the power supply voltage Vth supplied to the bitline BL0_E and the sense node SO0, and a shutoff control signal BLSHF of a determined level, e.g., 1.3 volt, is continuously applied to a gate terminal of the NMOS transistor 235. As a result, the voltage of the sense node SO0 is fluctuated with the voltage of the bitline BL0_E to develop the bitline BL0_E and the sense node SO0 simultaneously.

For the develop period, if a memory cell connected to a selected wordline is an ON cell, the voltage level of the bitline BL0_E and the sense node SO0 goes to a low level, e.g., 0.3 volt. On the other hand, if the memory cell is an OFF cell, the bitline BL0_E and the sense node SO0 are maintained at a precharge level, e.g., 0.8 volt. Since a develop result of the sense node SO0 is identical to that of the bitline BL0_E, it is determined whether a corresponding memory cell is an ON cell or an OFF cell, based on the voltage level of the developed sense node SO0. Before detecting the develop result, the PMOS transistor 231 is momentarily turned on just before latch to compensate voltage loss arising from the sense node SO0 at develop. Thus, a power supply voltage Vdd is momentarily supplied to the sense node SO0 to recharge a voltage of the sense node SO0 corresponding to an OFF cell to a level of the power supply voltage Vdd. As a result, correct data may be sensed from the sense node SO0.

Figure 3:
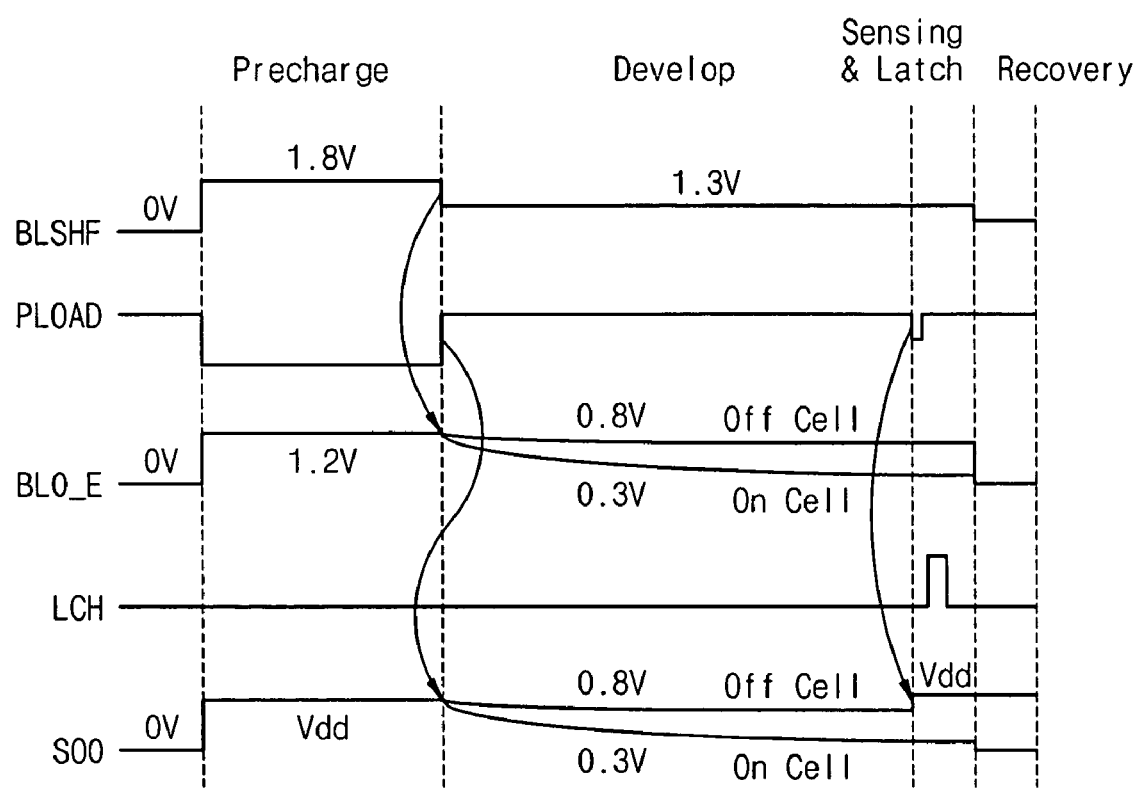
FIG. 3 is a timing diagram of the page buffer shown in FIG. 1.

FIG. 3 is a timing diagram of the page buffer 201 shown in FIG. 1 and FIG. 2. Referring to FIG. 2 and FIG. 3, an operation period of the page buffer 201 is divided into a precharge period, a develop period, and a sense & latch period, and a recovery period.

When the precharge period is started, a precharge control signal PLOAD applied to a PMOS transistor 231 transitions from a high level to a low level and a shutoff control signal BLSHF transitions from a low level to a high level. For this reason, the PMOS transistors 231 and an NMOS transistors 235 constructed in a precharge circuit 230 are all turned on. As a result, a sense node SO0 and a bitline BL0_E are all precharged by a power supply voltage Vdd.

When the bitline develop period is started, a shutoff control signal BLSHF applied to a gate terminal of the NMOS transistor goes down to a predetermined level, e.g., 1.3 volt. At the same time, the precharge control signal PLOAD applied to a gate terminal of the PMOS transistor transitions from a low level to a high level to cut off the supply of the power supply voltage Vdd to the sense node SO0. Thus, the voltage of the sense node SO0 is fluctuated with the voltage of the bitline BL0_E. As a result, the bitline BL0_E and the sense node SO0 are developed at one time.

After the bitline BL0_E and the sense node SO0 are all developed, the precharge control signal PLOAD is momentarily activated from a high level to a low level prior to activation of a latch signal LCH. Thus, the power supply voltage Vdd is temporarily supplied to the sense node SO0. As a result, a voltage of a sense node SO0 corresponding to an OFF cell is recharged to the level of the power supply voltage Vdd to conduct a correct read operation.

In the present invention, the sense node SO0 is developed while the bitline BL0_E is developed. A develop result of the sense node SO0 is wholly used to detect an ON cell and an OFF cell. Particularly, since the sense node SO0 is gradually developed while the bitline BL0_E is developed, it is barely affected by parasitic capacitances existing between sense nodes of page buffers. Hence, the read error is suppressed to obtain a stable read result. A read method of a flash memory device according to the present invention will now be described below with reference to FIG. 4.

Figure 4:
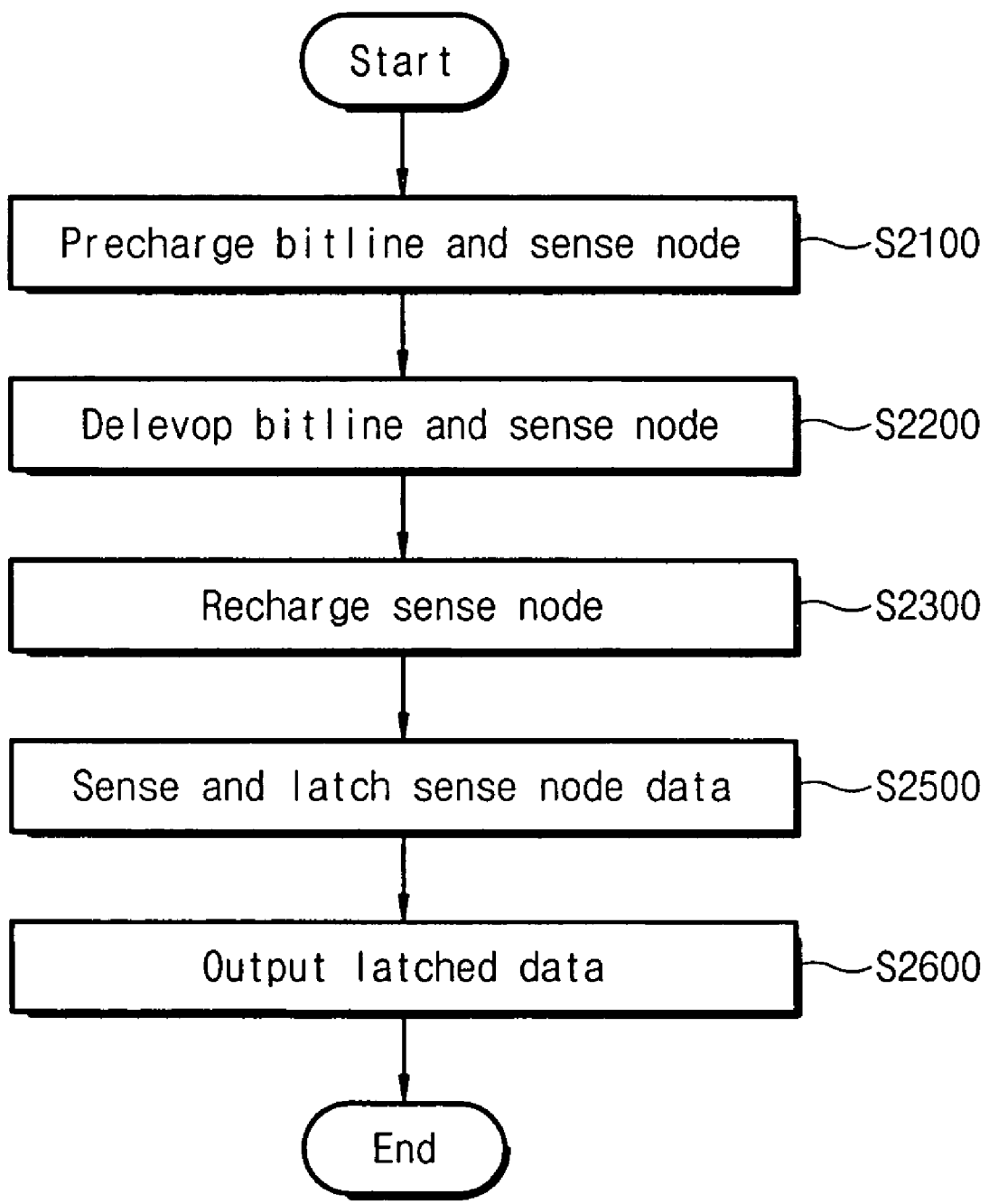
FIG. 4 is a flowchart of a read method of the flash memory device according to an embodiment of the present invention.

As illustrated in FIG. 4, a bitline and a sense node are precharged (S2100). A read voltage is applied to develop the bitline and the sense node (S2200). A develop result of the sense node is wholly based on that of a corresponding bitline.

A power supply voltage Vdd is momentarily applied to the sense node to compensate voltage loss caused by the sense node develop, so that the sense node is recharged to a level of the power supply voltage Vdd (S2300). Data is sensed from the sense node and the sense result is latched (S2500). The latched data is output as read data (S2600). According to the recharge operation of a sense node such as the S2300, the sense node may have the level of the power supply voltage Vdd when a corresponding memory cell is an OFF cell. On the other hand, the sense node is not affected by the recharge operation and maintained at a low level when the corresponding memory cell is an ON cell. Thus, accuracy for the read data is enhanced.

As described herein, at a read operation, a sense node of a page buffer is developed while a bitline is developed and data of a selected memory cell is sensed based on the develop result of the sense node. For a develop period, voltage loss arising from the sense node is compensated fast and the compensated result is latched to obtain more accurate and stable read result. In design of page buffers, there is no need to consider parasitic capacitances between sense nodes, which makes it possible to simplify the design and reduce a chip size.

While the present invention has been described with reference to preferred embodiments, those skilled in the art will recognize that modifications changes may be made in form and detail without departing from the spirit and scope of the invention.

What is claimed is:

1. A read method of a flash memory device, comprising:
   precharging a bitline and a sense node;
   developing the bitline and the sense node,
   wherein developing the bitline and the sense node comprises providing time for a precharge level transition;
   recharging the sense node to compensate voltage loss of the sense node; and
   after recharging the sense node, sensing a data value of a selected memory cell in response to the develop result of the sense node,
   wherein both the precharging operation and the recharging operation are always performed before the sensing operation is performed in each read cycle without regard to the data value of the selected memory cell.

2. The read method as recited in claim 1, wherein the sense node is developed while the bitline is developed.

3. The read method as recited in claim 1, wherein the sense node has a develop result corresponding to a develop result of the bitline.

4. A flash memory device comprising:
   a memory cell array including a plurality of memory cells disposed at intersections of bitlines and wordlines; and
   a page buffer circuit including a plurality of page buffers for sensing data stored in the memory cells,
   wherein each of the page buffers precharges a corresponding bitline and a corresponding sense node and develops the sense node while the bitline is developed and senses a data value of a memory cell connected to a selected bitline in response to the develop result of the sense node, wherein developing the bitline and the sense node comprises providing time for a precharge level transition; and
   wherein the page buffer recharges the sense node before sensing the data value, to compensate voltage loss of the sense node, and
   wherein the page buffer performs both the precharging operation and the recharging operation before the sensing operation is always performed in each read cycle without regard to the data value of the memory cell connected to the selected bitline.

5. The flash memory device as recited in claim 4, wherein the sense node has a develop result corresponding to a develop result of the bitline.

6. A flash memory device comprising:
   a memory cell array including a plurality of memory cells disposed at intersections of bitlines and wordlines; and
   a page buffer circuit including a plurality of page buffers for sensing data stored in the memory cells,
   wherein each of the page buffers comprises:
   a precharge circuit for precharging a corresponding bitline and a corresponding sense node and developing the sense node while the bitline is developed;
   wherein developing the bitline and the sense node comprises providing time for a precharge level transition; and
   a sense and latch circuit for sensing and storing a data value of a memory cell connected to a selected bitline in response to the develop result of the sense node,
   wherein the page buffer recharges the sense node before sensing the data value, to compensate voltage loss of the sense node, and
   wherein the page buffer performs both the precharging operation and the recharging operation before the sensing operation is always performed in each read cycle without regard to the data value of the memory cell connected to the selected bitline.

7. The flash memory device as recited in claim 6, wherein the precharge circuit comprises:
   a first transistor for supplying a precharge circuit to the sense node and the bitline in response to a first control signal; and
   a second transistor for controlling a precharge level of the bitline in response to a second control signal.

8. The flash memory device as recited in claim 7, wherein the precharge level of the bitline has a value obtained by subtracting a threshold voltage value of the second transistor from a voltage level of the second control signal.

9. The flash memory device as recited in claim 7, wherein after the bitline and the sense node are precharged, the first transistor cuts off the supply of the precharge voltage in response to the first control signal.

10. The flash memory device as recited in claim 8, wherein after the bitline and the sense node are precharged, the second control signal having a higher level than the precharge level is applied to the second transistor to match voltage levels of the bitline and the sense node.

11. The flash memory device as recited in claim 10, wherein the sense node has a develop result corresponding to a develop result of the bitline.

12. The flash memory device as recited in claim 7, wherein the first transistor supplies the precharge voltage to the sense node in response to the first control signal for a predetermined time before the data is sensed.

* * * * *